United States Patent
Cho et al.

(10) Patent No.: US 8,582,367 B2
(45) Date of Patent: Nov. 12, 2013

(54) SEMICONDUCTOR MEMORY DEVICE AND METHOD OF OPERATING THE SAME

(75) Inventors: Myung Cho, Changwon-si (KR); Hwang Huh, Cheongju-si (KR); Jung Hwan Lee, Seoul (KR); Ji Hwan Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 157 days.

(21) Appl. No.: 13/177,764

(22) Filed: Jul. 7, 2011

(65) Prior Publication Data

US 2012/0008416 A1  Jan. 12, 2012

(30) Foreign Application Priority Data

Jul. 9, 2010  (KR) .................. 10-2010-0066613

(51) Int. Cl.
| G11C 16/06 | (2006.01) |
| G11C 16/04 | (2006.01) |
| G11C 7/10 | (2006.01) |
| G11C 7/22 | (2006.01) |
| G11C 29/00 | (2006.01) |

(52) U.S. Cl.
USPC ............ 365/185.21; 365/185.17; 365/189.05; 365/189.14; 365/201

(58) Field of Classification Search
USPC ................................................. 365/185.21
See application file for complete search history.

(56) References Cited

U.S. PATENT DOCUMENTS

| 6,671,204 | B2 * | 12/2003 | Im ............................. 365/185.12 |
| 6,882,569 | B2 * | 4/2005 | Hosono et al. ........... 365/185.17 |
| 7,515,483 | B2 * | 4/2009 | Han ........................ 365/189.05 |
| 7,639,544 | B2 * | 12/2009 | Hosono et al. ........... 365/185.21 |
| 7,660,162 | B2 * | 2/2010 | Cho ........................ 365/185.21 |
| 7,697,341 | B2 * | 4/2010 | Cha et al. ................. 365/185.22 |
| 7,986,559 | B2 * | 7/2011 | Lee et al. ................. 365/185.22 |
| 8,120,964 | B2 * | 2/2012 | Ahn ........................ 365/185.21 |
| 8,149,621 | B2 * | 4/2012 | Kim et al. ................. 365/185.11 |
| 8,179,722 | B2 * | 5/2012 | Huh ........................ 365/185.12 |
| 8,195,993 | B2 * | 6/2012 | Okukawa et al. ........... 714/718 |
| 8,300,460 | B2 * | 10/2012 | Cho .......................... 365/185.05 |
| 2003/0076719 | A1 * | 4/2003 | Byeon et al. .................. 365/200 |
| 2005/0018488 | A1 * | 1/2005 | Kim et al. ................. 365/185.28 |

FOREIGN PATENT DOCUMENTS

KR  1020080038931 A  5/2008

* cited by examiner

*Primary Examiner* — Son Mai
(74) *Attorney, Agent, or Firm* — William Park & Associates Patent Ltd.

(57) ABSTRACT

A semiconductor memory device includes a memory cell array comprising a plurality of cell strings and a page buffer group comprising a plurality of page buffers coupled to the respective cell string through bit lines. Each of the page buffers includes a latch unit for storing data to be programmed into memory cells included in the cell string or for storing data read from the memory cells. Each of the page buffers is coupled to a pad for the test operation of the memory cells according to data stored in the latch unit in the test operation.

18 Claims, 4 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0066613 filed on Jul. 9, 2010, the entire disclosure of which is incorporated by reference herein, is claimed.

BACKGROUND

Exemplary embodiments relate generally to a semiconductor memory device and, more particularly, to a semiconductor memory device for measuring a cell current.

In memory products, such as flash memory, the operations of memory cells for storing data need to be tested in the production process of the memory cells.

A method of measuring a cell current may be used in order to check whether memory cells have proper operational characteristics. Also, a test circuit for measuring the cell current may be used.

When a signal for measuring the cell current is applied to a memory device, a current path from a pad of a memory chip to a cell string including memory cells is formed.

A page buffer is selected from page buffers. In order to measure the cell current of a bit line coupled to the selected page buffer, lots of circuits may be required within the page buffer, thereby making the entire circuit complicated. This may cause an increase in the size of the memory chip.

BRIEF SUMMARY

An exemplary embodiment relates to a reduction in the chip size by implementing circuits necessary only when the operational characteristics of memory cells are tested using the existing circuit of a page buffer.

A semiconductor memory device according to an aspect of the present disclosure includes a memory cell array comprising a plurality of cell strings and a page buffer group comprising a plurality of page buffers coupled to the respective cell string through bit lines. Each of the page buffers is configured to include a latch unit for storing data to be programmed into memory cells included in the cell string or for storing data read from the memory cells and is coupled to a pad for the test operation of the memory cells according to data stored in the latch unit in the test operation.

A semiconductor memory device according to another aspect of the present disclosure includes a memory cell array comprising a plurality of cell strings, a plurality of page buffers coupled to the respective cell string through bit lines, each of the page buffers comprising a latch unit configured to store data to be programmed into memory cells included in the cell string or store data read from the memory cells, and a plurality of first coupling circuits configured to couple the page buffer to the pad for the test operation of the memory cells according to data stored in the latch unit in the test operation.

A method of measuring current of a semiconductor memory device according to another aspect of the present disclosure includes storing data in memory cells selected for a test operation and in the latch of a page buffer coupled to the memory cells through a bit line, coupling the bit line and a pad for a test operation through the page buffer according to the data stored in the latch in response to a test signal, and testing characteristics of the memory cells through the bit line coupled to the pad.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
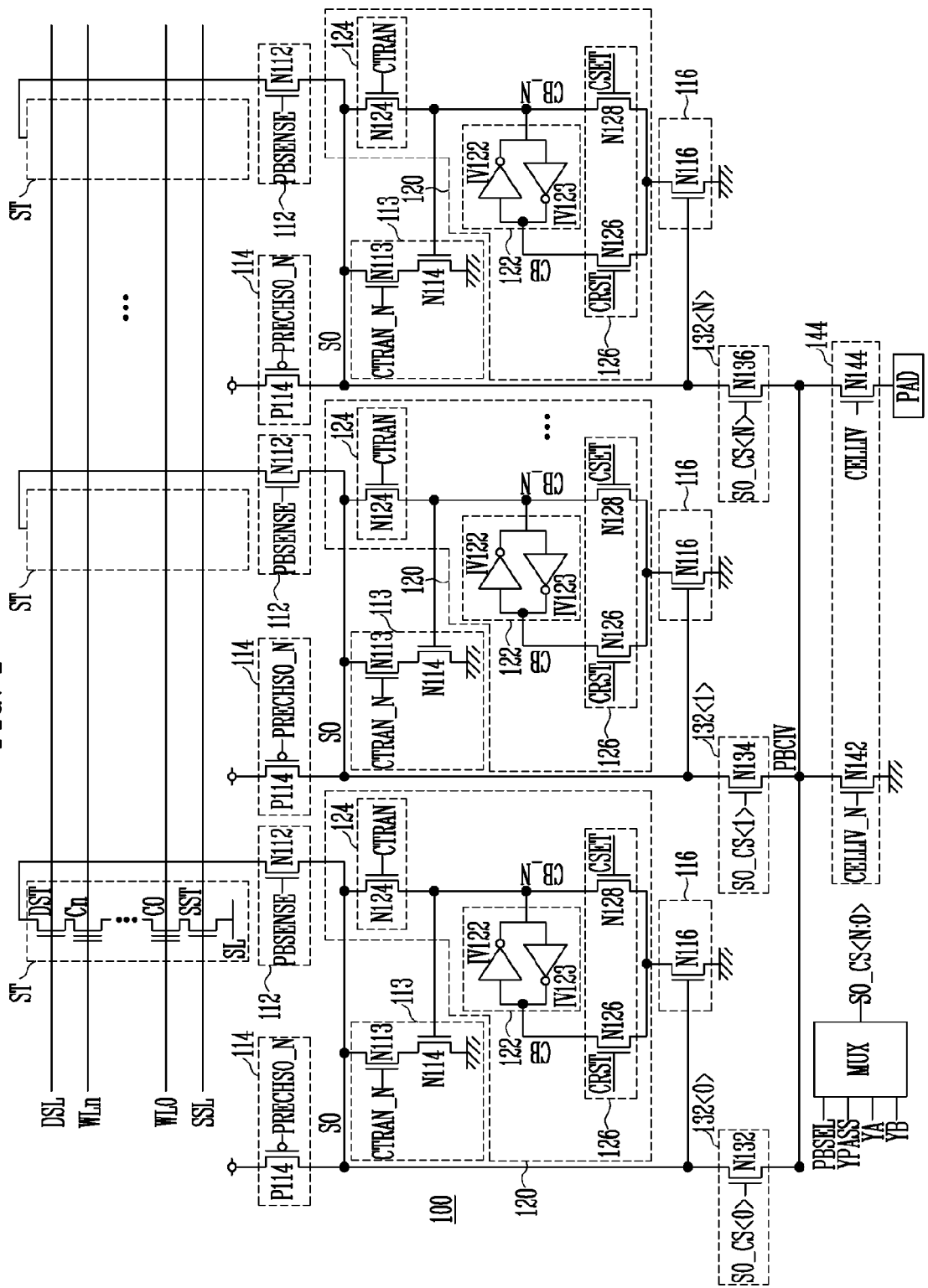
FIG. 1 is a circuit diagram of a semiconductor memory device for measuring a cell current according to an exemplary embodiment of this disclosure.
Figure 2:
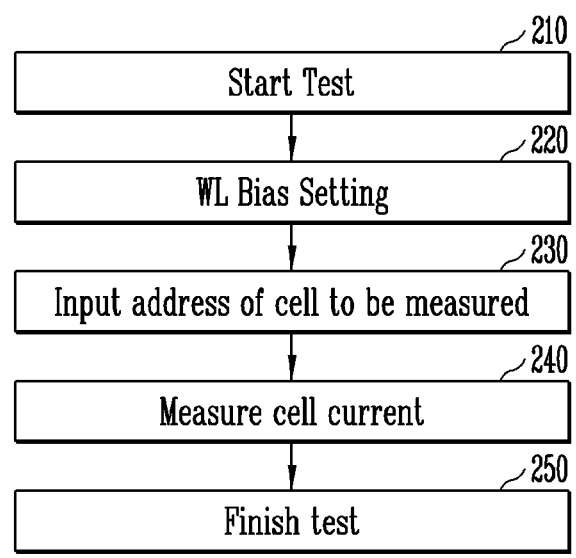
FIG. 2 is a flowchart illustrating a method of measuring a cell current in the semiconductor memory device of FIG. 1.

FIG. 1 is a circuit diagram of a semiconductor memory device for measuring a cell current according to an exemplary embodiment of this disclosure. FIG. 2 is a flowchart illustrating a method of measuring a cell current in the semiconductor memory device of FIG. 1.

Referring to FIG. 1, the semiconductor memory device according to the exemplary embodiment includes memory cells C0 to Cn, page buffers 100, sense node column selection circuits 132<0> to 132<N> coupled to the respective page buffers 100, and a coupling circuit 144.

Cell strings ST, each including the memory cells C0 to Cn, are coupled to respective bit lines. The memory cells C0 to Cn of each cell string ST are coupled to word lines WL0 to WLn.

Each of the page buffers 100 further includes a bit line sense unit 112, a sense node discharge unit 113, a sense node precharge unit 114, a sense node sense unit 116, and a register 120.

The bit line sense unit 112 is turned on in response to a bit line sense signal PBSENSE and includes an NMOS transistor N112 coupled between the bit line and a sense node SO. The bit line sense unit 112 transfers a sense voltage to the sense node SO in verification and read operations so that a state of a specific memory cell can be sensed.

The sense node precharge unit 114 supplies voltage of a high level to the sense node SO in response to a precharge signal PRECHSO_N. To this end, the sense node precharge unit 114 includes a PMOS transistor P114 coupled between a power supply voltage terminal and the sense node SO. The power supply voltage of a high level is supplied to the sense node SO in response to the precharge signal PRECHSO_N of a low level.

The sense node sense unit 116 supplies a ground voltage to the register 120 according to voltage of the sense node SO. To this end, the sense node sense unit 116 includes an NMOS transistor N116 configured to have a gate coupled to the sense node SO and coupled between the register 120 and the ground terminal. The ground voltage is supplied to the register 120 according to voltage of the sense node SO.

The register 120 includes a latch unit 122 for storing data, a data set/reset unit 126 for transferring the ground voltage, received from the sense node sense unit 116, to the latch unit 122 in response to data reset and set signals CRST and CSET, and a data transmission unit 124 for transferring data of the first node CB_N of the latch unit 122 to the sense node SO.

The latch unit 122 includes a first inverter IV122 and a second inverter IV123 having one input terminal coupled to the other output terminal and having one output terminal coupled to the other input terminal. A node where the output terminal of the first inverter IV122 is coupled to the input terminal of the second inverter IV123 is called the first node CB_N. A node where the input terminal of the first inverter IV122 is coupled to the output terminal of the second inverter IV123 is called a second node CB. Data of opposite levels are maintained in the first node CB_N and the second node CB, respectively.

The data set/reset unit 126 includes an NMOS transistor N128 and an NMOS transistor N126. The NMOS transistor N128 transfers the ground voltage, received via the sense node sense unit 116 when the sense node SO is charged, to the first node CB_N in response to a first data set signal CSET. The NMOS transistor N126 supplies the ground voltage, received via the sense node sense unit 116 when the sense node SO is charged, to the second node CB in response to a second data reset signal CRST.

The data transmission unit 124 includes an NMOS transistor N124 for transferring the data of the first node CB_N of the latch unit 122 to the sense node SO in response to a data transmission signal CTRAN. Accordingly, the data of the first node CB_N can be transmitted to the sense node SO in response to the data transmission signal CTRAN.

The sense node discharge unit 113 discharges the sense node SO in response to an inverse data transmission signal CTRAN_N and a data level of the first node CB_N of the register 120. The sense node discharge unit 113 includes first and second NMOS transistors N113 and N114 coupled in series between the sense node SO and the ground terminal. The first NMOS transistor N113 coupled to the sense node SO is turned on according to a data level of the inverse data transmission signal CTRAN_N. The second NMOS transistor N114 coupled to the ground terminal is turned on according to a data level of the first node CB_N. In the exemplary embodiment, the second NMOS transistor N114 coupled to the ground terminal may be turned on according to a level of the inverse data transmission signal CTRAN_N, and the first NMOS transistor N113 coupled to the sense node SO may be turned on according to a data level of the first node CB_N. When the inverse data transmission signal CTRAN_N is applied and the data of the first node CB_N has a high level, the sense node SO is discharged.

The sense node column selection circuits 132<0> to 132<N> are coupled in parallel between a test node PBCIV and the respective sense nodes SO of the page buffers 100. The sense node column selection circuits 132<0> to 132<N> include respective NMOS transistors N132 to N136 which are turned on according to the respective levels of sense node column selection signals SO_CS<0> to SO_CS<N>.

The coupling circuit 144 includes a first NMOS transistor N142 coupled between the test node PBCIV and the ground terminal and a second NMOS transistor N144 coupled between the test node PBCIV and a current measurement pad PAD. The first NMOS transistor N142 is turned on in response to an inverse test signal CELLIV_N, thus coupling the test node PBCIV and the ground terminal. The second NMOS transistor N144 is turned on in response to a test signal CELLIV, thus coupling the test node PBCIV and the current measurement pad PAD.

Referring to FIG. 2, a method of measuring the cell current of the semiconductor memory device configured as described above is described below.

When a test for measuring the cell current is started at step 210, the inverse test signal CELLIV_N is applied to the coupling circuit 144. In response to the inverse test signal CELLIV_N, the first NMOS transistor N142 of the coupling circuit 144 is turned on and the second NMOS transistor N144 is turned off. Accordingly, the test node PBCIV is coupled to the ground terminal and thus discharged.

Next, the biases of the word lines WL0 to WLn are set at step 220. That is, in order to measure current flowing through the cell string ST, voltage capable of turning on the memory cells C0 to Cn is supplied to the word lines WL0 to WLn.

Next, an address of the cell string ST is inputted at step 230. The address of the cell string ST refers to the address (that is, a column address) of a page buffer.

In other words, a page buffer coupled to a bit line whose cell current will be measured has to be selected from among a plurality of page buffers.

In the exemplary embodiment, a page buffer whose cell current will be measured is selected using a multiplexer MUX, and the page buffer 100 on the leftmost side in FIG. 1 is assumed to be selected.

Referring back to FIG. 1, signals inputted to the multiplexer MUX include signals PBSEL, YPASS, YA, and YB. The signals are related to the column address of a page buffer, and a detailed description thereof is omitted.

When the column address of the page buffer 100 is inputted to the input terminal of the multiplexer MUX, the sense node column selection signal SO_CS<0> of the page buffer 100 is applied. The NMOS transistor N132 of the sense node column selection circuit 132<0> is turned on in response to the sense node column selection signal SO_CS<0>, so that the sense node SO of the page buffer 100 is coupled to the test node PBCIV.

Next, when the second NMOS transistor N144 is turned on in response to the test signal CELLIV inputted to the coupling circuit 144, the test node PBCIV and the current measurement pad PAD are coupled, so that the cell current can be measured at step 240. After the cell current is measured, the test is finished at step 250.

As described above, in order to measure a cell current, the cell current measurement pad PAD is coupled to the sense node SO of a selected page buffer to which a bit line whose cell current will be measured is coupled. In order to determine the sense node SO of the selected page buffer, the sense node column selection signal is outputted according to an address of the selected page buffer. The selection signal of the selected page buffer maintains a high level, and the selection signals of unselected page buffers maintain a low level. The cell current of the selected page buffer can be measured by coupling the sense node SO of the selected page buffer to the cell current measurement pad PAD.

The above method requires the multiplexer for outputting the sense node column selection signal according to the column address of a page buffer and also requires the transistor for supplying sense node column selection signal within the page buffer. Accordingly, the chip size may increase because of the circuits which are necessary only in a test operation.

Hereinafter, a semiconductor memory device which can obviate the test circuits for the test operation and thus reduce the chip size, by implementing the test circuits using the existing circuit within a page buffer, is described.

Figure 3:
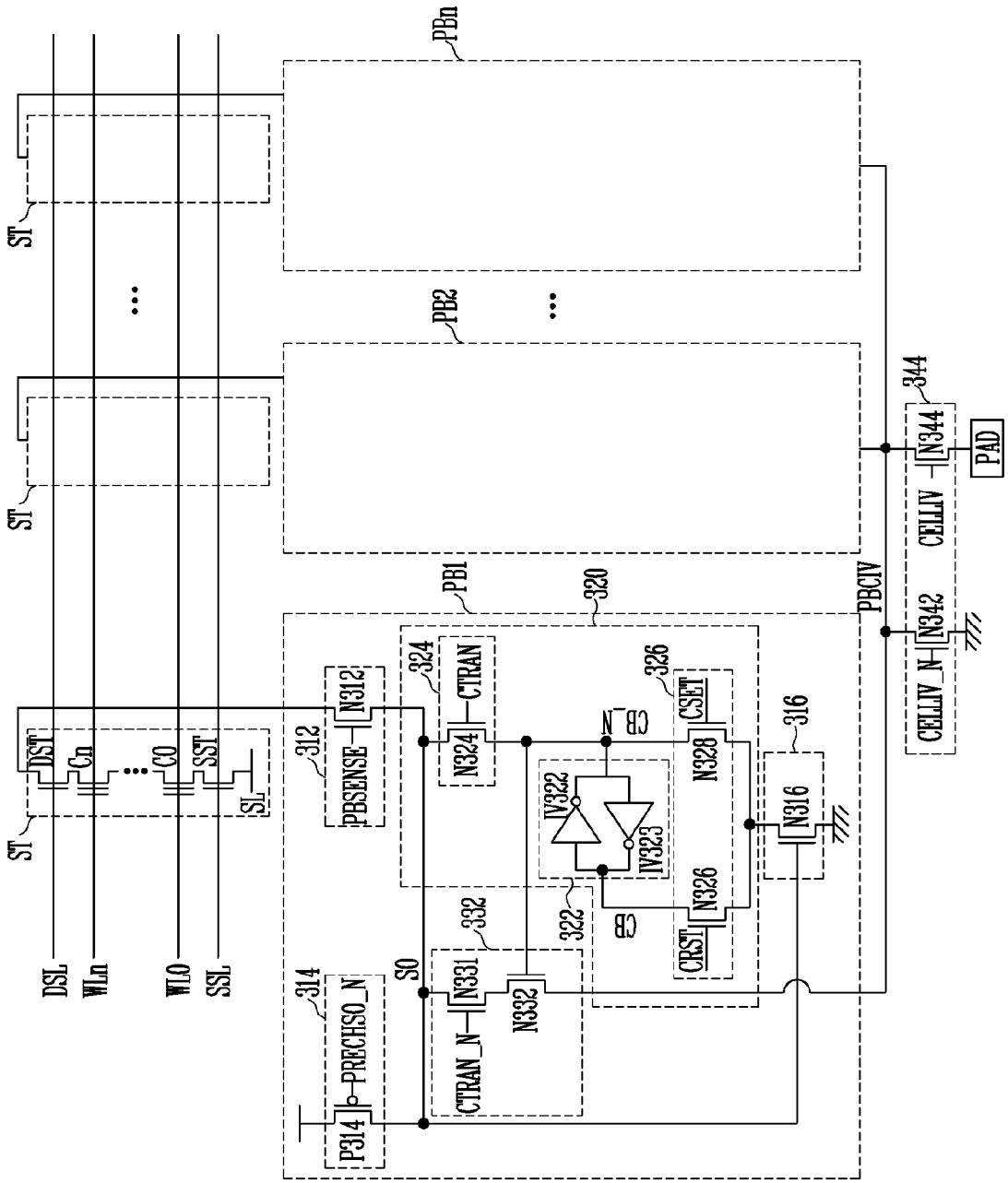
FIG. 3 is a circuit diagram of a semiconductor memory device for measuring a cell current according to another exemplary embodiment of this disclosure.
Figure 4:
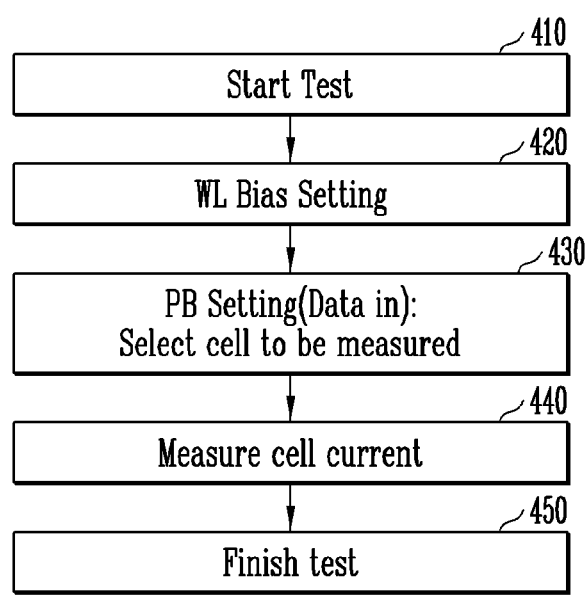
FIG. 4 is a flowchart illustrating a method of measuring a cell current in the semiconductor memory device of FIG. 3.

FIG. 3 is a circuit diagram of a semiconductor memory device for measuring a cell current in according to another exemplary embodiment of this disclosure. FIG. 4 is a flowchart illustrating a method of measuring a cell current in the semiconductor memory device of FIG. 3.

Referring to FIG. 3, the semiconductor memory device according to another exemplary embodiment of this disclosure includes a memory cell array having memory cells C0 to Cn and a page buffer group having page buffers PB1 to PBn. The semiconductor memory device may further include a coupling circuit 344.

A bit line is coupled to each of cell strings ST, each including the memory cells C0 to Cns.

The coupling circuit 344 couples a pad PAD to a test node PBCIV in response to a test signal CELLIV when a test operation for the memory cells C0 to Cn is performed.

Each of the page buffers PB1 to PBn includes a latch unit 322 for the data input and output operations of the memory cells C0 to Cn (that is, for storing data to be programmed into the memory cells C0 to Cn or storing data read from the memory cells C0 to Cn). The page buffer couples the bit line to the test node PBCIV according to data stored in the latch unit 322 in the test operation of the memory cells C0 to Cn.

Each of the page buffers PB1 to PBn includes a bit line sense unit 312, a sense node precharge unit 314, a sense node sense unit 316, and a register 320.

The elements and configurations of each of the page buffers PB1 to PBn are similar to those of the page buffer shown in FIG. 1, and a detailed description thereof is omitted.

Unlike in the embodiment described above, the sense node coupling unit 332 couples the sense node SO of the page buffer to the test node PBCIV in response to the inverse data transmission signal CTRAN_N and a data level of the first node CB_N of the latch unit 322. The sense node coupling unit 332 includes first and second NMOS transistors N331 and N332 coupled in series between the sense node SO and the test node PBCIV. The first NMOS transistor N331 coupled to the sense node SO is turned on according to a level of the inverse data transmission signal CTRAN_N. The second NMOS transistor N332 coupled to the test node PBCIV is turned on according to a data level of the first node CB_N of the latch unit 322.

In the another exemplary embodiment, the second NMOS transistor N332 coupled to the test node PBCIV may be turned on according to a level of the inverse data transmission signal CTRAN_N, and the first NMOS transistor N331 coupled to the sense node SO may be turned on according to a data level of the first node CB_N. Accordingly, the sense node SO is coupled to the test node PBCIV when the inverse data transmission signal CTRAN_N is received and the first node CB_N has data of a high level.

The coupling circuit 344 may have the same configuration as the coupling circuit 144 of FIG. 1. The coupling circuit 344 includes a first NMOS transistor N342 coupled between the test node PBCIV and a ground terminal and a second NMOS transistor N344 coupled between the test node PBCIV and the pad PAD. The first NMOS transistor N342 is turned on in response to an inverse test signal CELLIV_N, thus coupling the test node PBCIV to the ground terminal. The second NMOS transistor N344 is turned on in response to the test signal CELLIV, thus coupling the test node PBCIV to the pad PAD.

Referring to FIG. 4, a method of measuring a cell current in the semiconductor memory device having the above configuration is described below.

When a test operation for measuring the cell current is started at step 410, the inverse test signal CELLIV_N is applied to the coupling circuit 344. In response to the signal, the first NMOS transistor N342 of the coupling circuit 344 is turned on and the second NMOS transistor N344 thereof is turned off. Accordingly, the test node PBCIV is coupled to the ground terminal and thus discharged.

Next, the biases of word lines WL0 to WLn coupled to the respective memory cells C0 to Cn of each string are set at step 420. That is, in order to measure the cell current flowing through the cell string ST, voltage capable of turning on the memory cells C0 to Cn is supplied to the word lines WL0 to WLn. In response to the bit line sense signal PBSENSE, the cell string ST is coupled to the sense node SO of the page buffer.

Next, a page buffer coupled to a bit line whose cell current will be measured is selected from among a plurality of the page buffers PB1 to PBn at step 430.

In another exemplary embodiment, a page buffer whose cell current will be measured is selected and the sense node of the selected page buffer is coupled to the pad PAD by implementing the function of the multiplexer using the existing circuit of a page buffer.

The data of the first node CB_N of the latch unit 322 of the selected page buffer is set to '1' so that the page buffer can be selected, and the data of the first nodes CB_N of the latch units 322 of the remaining page buffers is set to '0'.

That is, the function of the multiplexer is implemented by setting the data of the latch unit 322 of the page buffer.

When the first node CB_N of the latch unit 322 has data of a high level, the second NMOS transistor N332 of the sense node coupling unit 332 is turned on. When the first NMOS transistor N331 of the sense node coupling unit 332 is turned on in response to the inverse data transmission signal CTRAN_N of a high level, the sense node SO and the test node PBCIV are coupled.

Next, when the second NMOS transistor N344 of the coupling circuit 344 is turned on in response to the test signal CELLIV, the test node PBCIV and the pad PAD are coupled, so that the cell current can be measured at step 440. After the cell current is measured, the test operation is finished at step 450.

In the embodiments of this disclosure, an example in which the bit line having the memory cells C0 to Cn coupled thereto is coupled to the sense node SO, the sense node SO and the test node PBCIV are coupled, and the test node PBCIV and the pad PAD are then coupled has been described. However, the sequence may vary.

As described above, in the semiconductor memory device according to another exemplary embodiment, circuits necessary only when the operational characteristics of memory cells are tested are implemented using the circuits of a page buffer. Accordingly, additional circuits for a test operation may be obviated and the chip size may decrease.

That is, the transistor, coupled to the latch unit of a page buffer and used for data transmission, is selectively coupled to cell current measurement terminal during the test operation. Also, the transistor coupled to the ground terminal in order to set the page buffer, is selectively coupled to the cell current measurement terminal during the test operation. Furthermore, a page buffer coupled to a bit line whose cell current will be measured is selected by setting a data level of the node of the latch unit. Accordingly, the multiplexer for selecting a page buffer when a cell current is measured may be obviated.

Furthermore, since a control signal for selecting the sense node of the page buffer is not necessary, the transistor of the page buffer for receiving the control signal can be removed. Accordingly, the test operation can be simplified.

The exemplary embodiments of this disclosure are not implemented using only the apparatus and the method, but may be implemented using a program for realizing functions corresponding to the construction of the exemplary embodiment of this disclosure or a recording medium in which the program is stored. The implementations may be readily realized by a person having ordinary skill in the art from the description of the exemplary embodiments.

What is claimed is:

1. A semiconductor memory device, comprising:
    a plurality of cell strings, each of the cell strings comprising memory cells; and
    a plurality of page buffers, each of the page buffers coupled to the respective cell string through a bit line,
    wherein each of the page buffers comprises a latch unit configured to store data which is inputted in a test operation of the memory cells, and wherein each of the page buffers couples the bit line to a pad for the test operation of the memory cells according to the data stored in the latch unit in the test operation.

2. The semiconductor memory device of claim 1, wherein the page buffer further comprises:
    a bit line sense unit configured to couple the bit line and a sense node of the page buffer in response to a bit line sense signal; and
    a sense node coupling unit configured to couple the sense node to the pad for the test operation according to the data of the latch unit in the test operation.

3. The semiconductor memory device of claim 2, wherein the sense node coupling unit comprises a first switching element configured to couple the sense node to the pad according to the data of the latch unit.

4. The semiconductor memory device of claim 3, wherein the sense node coupling unit further comprises a second switching element coupled between the sense node and the first switching element, and wherein the second switching element is configured to couple the sense node and the first switching element in response to an inverse data transmission signal.

5. The semiconductor memory device of claim 1, further comprising a coupling circuit for coupling the page buffers to the pad in response to a test signal in the test operation.

6. The semiconductor memory device of claim 5, wherein the coupling circuit comprises a third switching element configured to couple the page buffer to the pad in response to the test signal.

7. The semiconductor memory device of claim 4, wherein the page buffer comprises:
    a sense node precharge unit configured to supply voltage of a high level to the sense node in response to a precharge signal;
    a sense node sense unit configured to supply a ground voltage to the latch unit according to a level of the voltage of the sense node;
    a data set/reset unit configured to transfer the ground voltage, received from the sense node sense unit, to the latch unit in response to data set/reset signals; and
    a data transmission unit configured to transfer the data of the latch unit to the sense node in response to a data transmission signal.

8. A semiconductor memory device, comprising:
    a plurality of cell strings, each of the cell strings comprising memory cells;
    a plurality of page buffers coupled to the respective cell string through bit lines, each of the page buffers comprising a latch unit configured to store data which is inputted in a test operation; and
    a plurality of first coupling circuits, each first coupling circuit configured to couple the page buffer to a pad for the test operation of the memory cells according to the data stored in the latch unit in the test operation.

9. The semiconductor memory device of claim 8, wherein the page buffer further comprises a bit line sense unit configured to couple the bit line and a sense node of the page buffer in response to a bit line sense signal.

10. The semiconductor memory device of claim 9, wherein the first coupling circuit configured to couple the sense node to the pad for the test operation according to the data of the latch unit in the test operation.

11. The semiconductor memory device of claim 10, wherein the first coupling circuit comprises a first switching element configured to couple the sense node to the pad according to the data of the latch unit.

12. The semiconductor memory device of claim 11, wherein the first coupling circuit further comprises a second switching element coupled between the sense node and the first switching element, and wherein the second switching element is configured to couple the sense node and the first switching element in response to an inverse data transmission signal.

13. The semiconductor memory device of claim 8, further comprising a second coupling circuit for coupling the first coupling circuits to the pad in response to a test signal in the test operation.

14. The semiconductor memory device of claim 13, wherein the second coupling circuit comprises a third switching element configured to couple the page buffer to the pad in response to the test signal.

15. The semiconductor memory device of claim 12, wherein the page buffer comprises:
    a sense node precharge unit configured to supply voltage of a high level to the sense node in response to a precharge signal;
    a sense node sense unit configured to supply a ground voltage to the latch unit according to a level of the voltage of the sense node;
    a data set/reset unit configured to transfer the ground voltage, received from the sense node sense unit, to the latch unit in response to data set/reset signals; and
    a data transmission unit configured to transfer the data of the latch unit to the sense node in response to a data transmission signal.

16. A method of measuring current of a semiconductor memory device, comprising:
    storing data in memory cells selected for a test operation and in a latch of a page buffer coupled to the memory cells through a bit line;
    coupling the bit line and a pad for a test operation through the page buffer according to the data stored in the latch in response to a test signal; and
    testing characteristics of the memory cells through the bit line coupled to the pad.

17. The method of claim 16, wherein the coupling of the bit line and the pad comprises:
    coupling the bit line and a sense node of the page buffer in response to a bit line sense signal; and
    coupling the sense node and the pad according to data stored in the latch in response to the test signal.

18. The method of claim 16, wherein, after coupling the bit line and the page buffer, the pad is coupled to the page buffer.

* * * * *